US007870928B1

(12) United States Patent
Jiang et al.

(10) Patent No.: US 7,870,928 B1

(45) Date of Patent: Jan. 18, 2011

(54) BASS REFLEX TYPE SPEAKER DEVICE

(75) Inventors: Bin Jiang, Shenzhen (CN); Man-Zhong Wang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/580,262

(22) Filed: Oct. 16, 2009

(30) Foreign Application Priority Data

Aug. 28, 2009 (CN) ........................ 2009 1 0306268

(51) Int. Cl.
*H05K 5/00* (2006.01)

(52) U.S. Cl. ....................................... 181/148; 181/156

(58) Field of Classification Search ................. 181/148, 181/156
See application file for complete search history.

(56) References Cited

U.S. PATENT DOCUMENTS

| | | | | |
|---|---|---|---|---|
| 6,141,428 | A * | 10/2000 | Narus | 381/338 |
| 6,237,715 | B1 * | 5/2001 | Tracy | 181/156 |
| 6,561,311 | B2 * | 5/2003 | Chuang | 181/199 |
| 7,252,175 | B2 * | 8/2007 | Suzuki | 181/156 |
| 7,410,029 | B2 * | 8/2008 | Tanaami | 181/156 |
| 2005/0123162 | A1 * | 6/2005 | Huffman | 381/337 |
| 2008/0169151 | A1 * | 7/2008 | Barrios et al. | 181/156 |

* cited by examiner

*Primary Examiner*—Lincoln Donovan
*Assistant Examiner*—Forrest M Phillips
(74) *Attorney, Agent, or Firm*—Frank R. Niranjan

(57) ABSTRACT

A bass reflex type speaker is disclosed. The bass reflex type speaker includes an enclosure, two speakers, and a bass reflex tube. The enclosure includes a main portion and two protruding portions protruding from the main portion. The main portion defines a sound cavity therein. The protruding portion defines a sound path therein communicating with the sound cavity. The two speakers are connected to the corresponding protruding portion to close the sound path. One end of the bass reflex tube is fixed in the enclosure, and the other end of the bass reflex tube extends out of the enclosure.

6 Claims, 5 Drawing Sheets

BASS REFLEX TYPE SPEAKER DEVICE

BACKGROUND

1. Technical Field

The present disclosure relates to speaker devices, particularly, to a bass reflex type speaker device.

2. Description of Related Art

High quality sound output is an important commercial feature of an electronic device. However, internal speaker of the electronic device often fails to satisfy the sound quality requirement. A method to improve the sound quality is connecting the electronic device to an external speaker device, such as a bass reflex type speaker device. However, the current bass reflex type speaker device is cumbersome because of a large size of the external speaker device.

What is needed, therefore, is a bass reflex type speaker device to overcome the above-mentioned problems.

BRIEF DESCRIPTION OF THE DRAWINGS

The components of the drawings are not necessarily drawn to scale, the emphasis instead being placed upon clearly illustrating the principles of the embodiments of the bass reflex type speaker device. Moreover, in the drawings, like reference numerals designate corresponding parts throughout several views.

DETAILED DESCRIPTION

Figure 1:
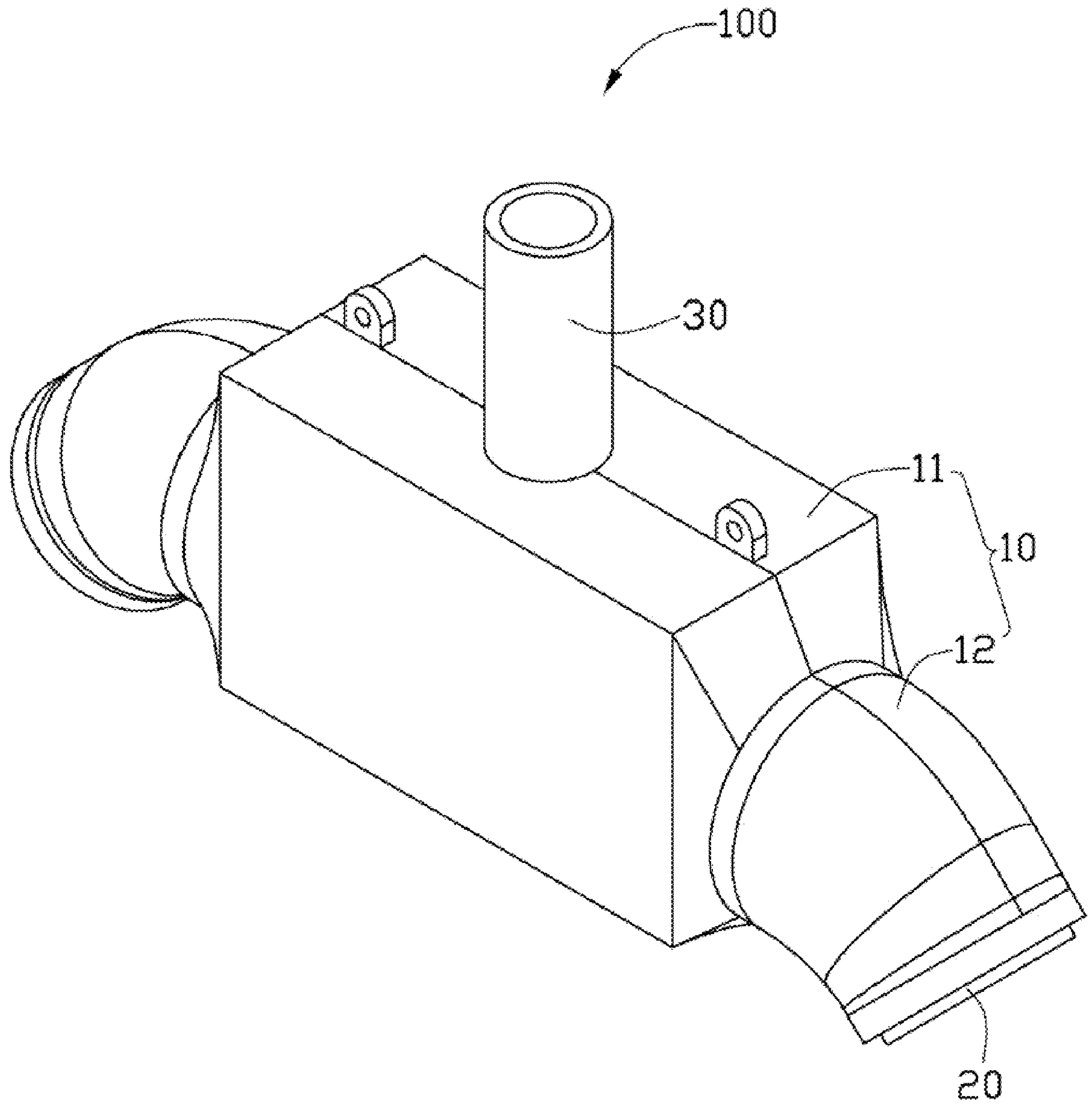
FIG. 1 is an isometric and schematic view of a bass reflex type speaker device, according to an exemplary embodiment of the present disclosure.
Figure 2:
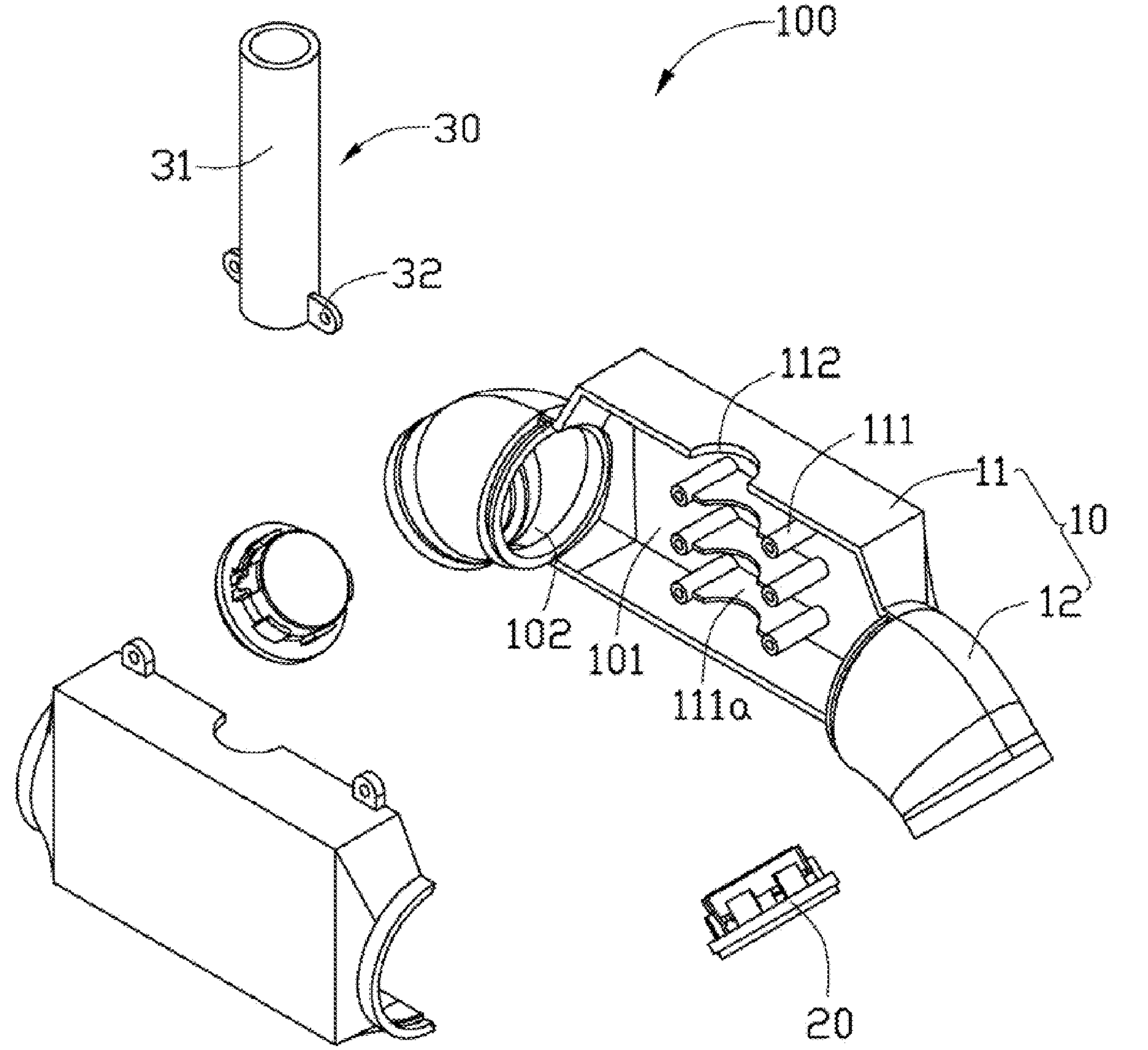
FIG. 2 is a disassembled view of the bass reflex type speaker device of FIG. 1.
Figure 3:
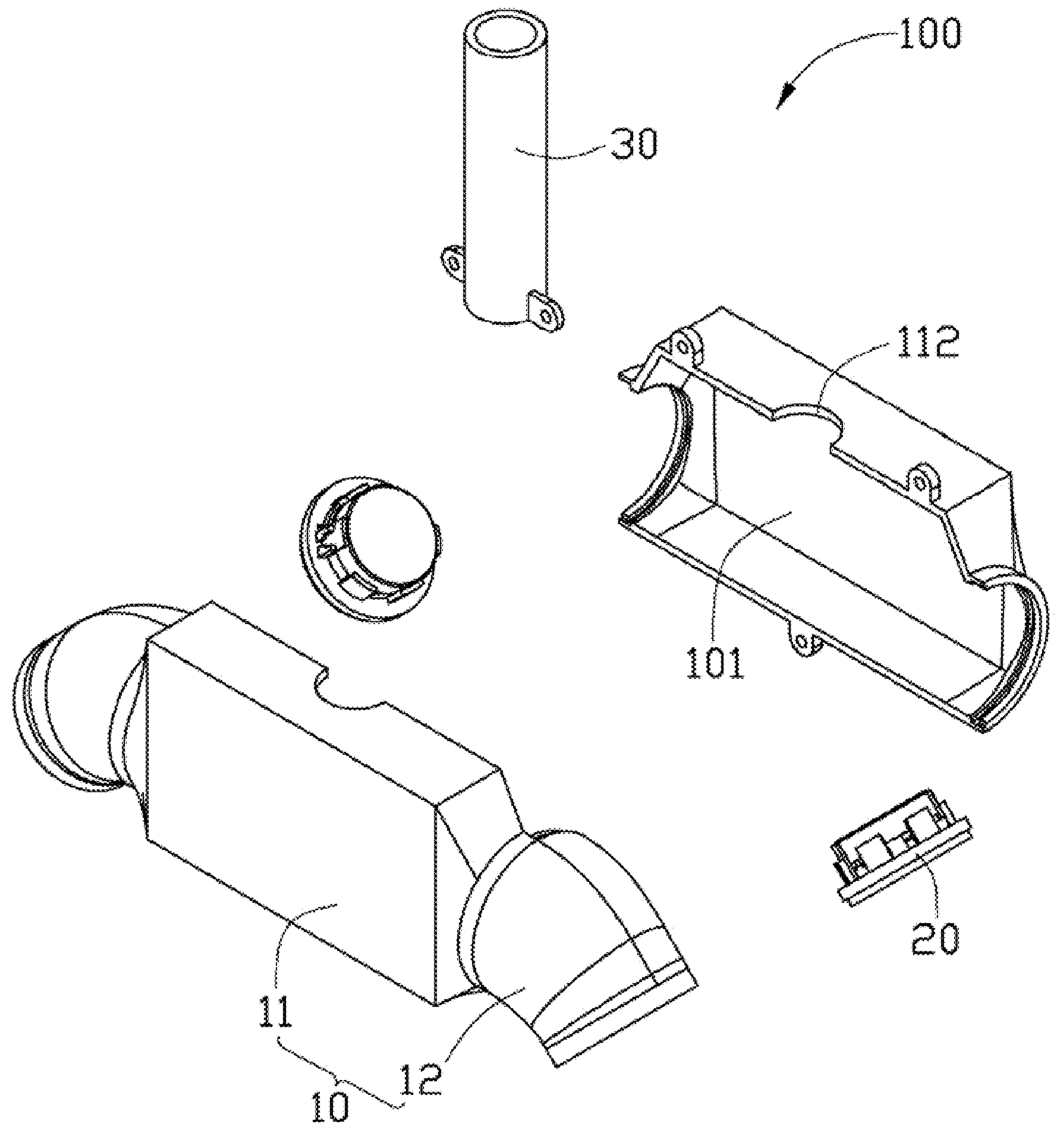
FIG. 3 is similar to FIG. 2, but viewed at another angle.

Referring to FIGS. 1-3, a bass reflex type speaker device 100, according to an exemplary embodiment, is shown. The base reflex type speaker 100 includes an enclosure 10, two speakers 20 and a bass reflex tube 30.

The enclosure 10 includes a main portion 11 and two protruding portions 12 corresponding to two speakers 20. The main portion 11 is substantially cuboid-shaped and defines a sound cavity 101. The main portion 11 includes a number of fixing poles 111 fixed in the inner surface of the main portion 11. The fixing poles 111 are positioned as two parallel rows. The main portion 11 includes a number of reinforcing plates 111*a*. Each of the reinforcing plates 111*a* is substantially perpendicular to a central axis of the bass reflex tube 30. Each of the reinforcing plates 111*a* is fixedly connected to two fixing poles 111 positioned along a direction substantially perpendicular to the bass reflex tube 30. The main portion 11 defines a through hole 112 above the two rows of the fixing poles 111. Each protruding portion 12 protrudes from the main potion 11 and is curved. The two protruding portions 12 are connected at opposite ends of the main portion 11 correspondingly. The protruding portion 12 defines a curved sound path 102 communicating with the sound cavity 101.

The bass reflex tube 30 includes a hollow cylindrical body 31 and two fixing portions 32 positioned on the outer surface of an end of the body 31 corresponding to the fixing poles 111. A ratio of the length of the body 31 to the diameter of the speaker 20 is larger than 2. In this embodiment, the length of the body 31 is about 80 millimeters, and the diameter of the speaker 20 is about 36 millimeters.

In assembly, each speaker 20 is fixed on an end of the corresponding protruding portion 12 to close the sound path 102. The end of the body 31 opposite the fixing portion 32 passes through the through hole 112 and extends out of the enclosure 10. The fixing portion 32 of the bass reflex tube 30 is fixedly connected to the fixing poles 111, and the extending length of the tube 30 can be adjusted by connecting the fixing portion 32 to different fixing poles 111 along the central axis of the tube 30.

Figure 4:
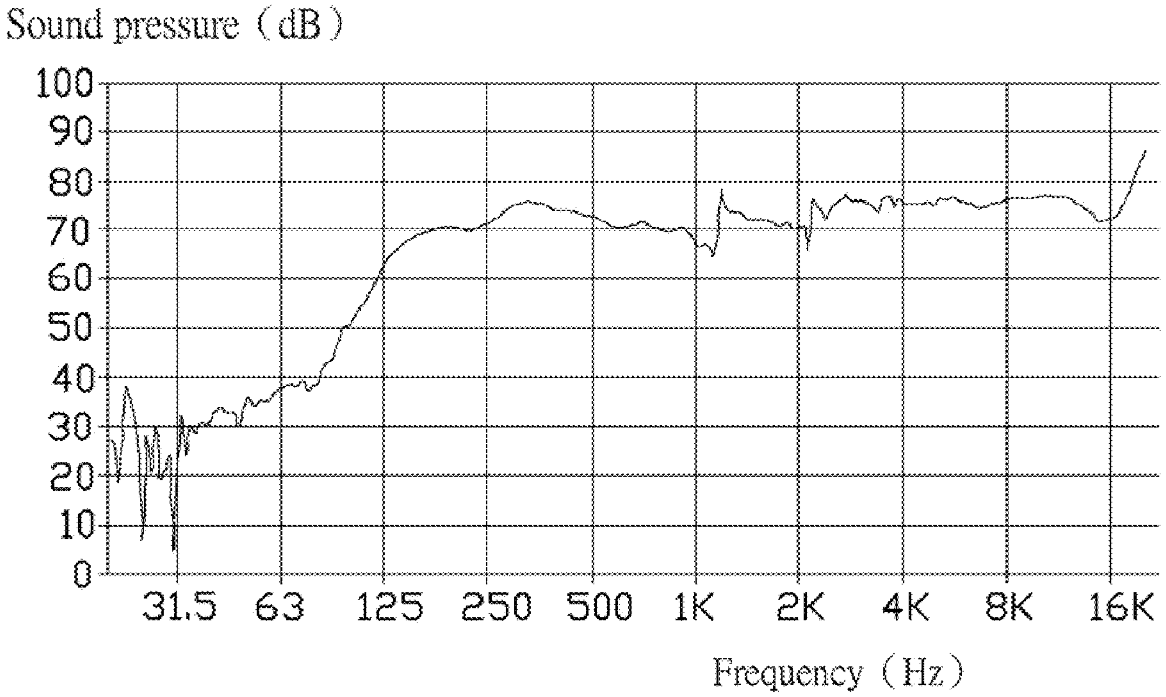
FIG. 4 is a bass response graph of the bass reflex type speaker device of FIG. 1.
Figure 5:
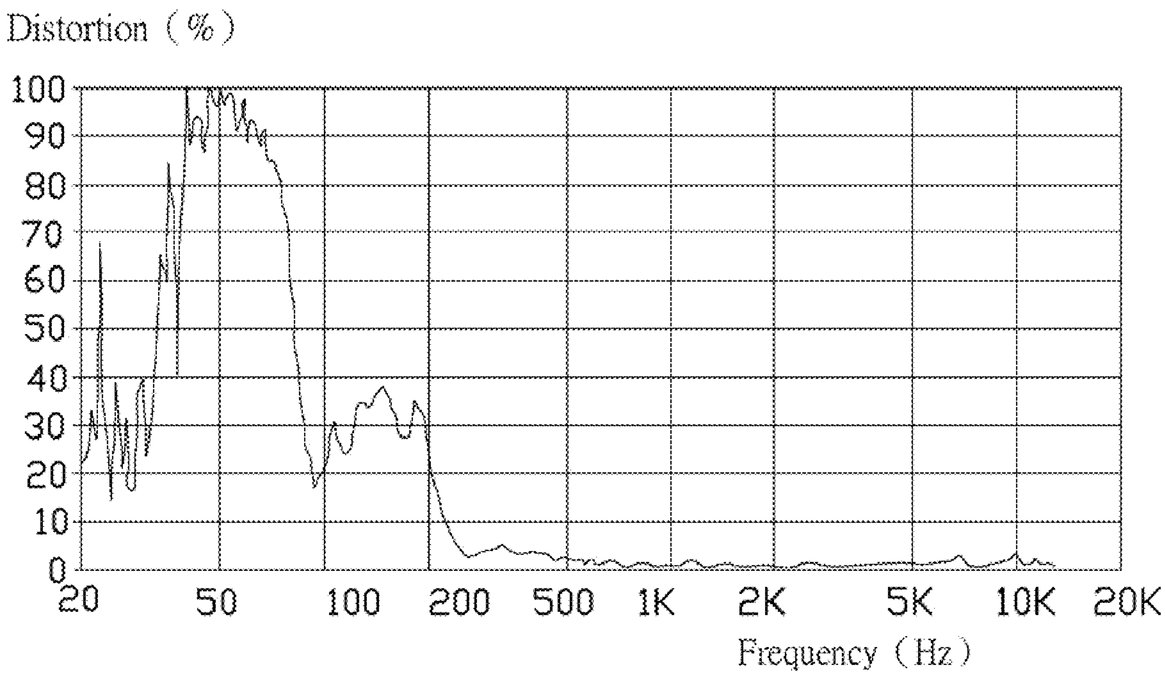
FIG. 5 is a distortion graph of the bass reflex type speaker device of FIG. 1.

Referring to FIG. 4 and FIG. 5, the bass reflex type speaker device 100 can transmit sound with frequency more than 140 Hz more clearly. Therefore, the bass reflex type speaker device 100 can output sound at a broader frequency range. The bass reflex type speaker device 100 can reduce distortion in the lower portion of the frequency range of sound.

The bass reflex type speaker 100 has a simple structure and reduced volume, and therefore, is suitable for portable requirement.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A bass reflex type speaker device, comprising:

an enclosure comprising a main portion and two protruding portions protruding from the main portion, the main portion defining a sound cavity, and the protruding portion defining a sound path therein, the sound path communicating with the sound cavity, the main portion comprising a plurality of fixing poles fixed in the inner surface of the main body and arranged in two parallel rows, the main portion defining a through hole above the two rows of the fixing poles along an alignment direction of the fixing poles in each of the rows;

two speakers corresponding to the two protruding portions and connected to the corresponding protruding portion to close the sound path; and a bass reflex tube with one end being inserted into the through hole and adjustably fixed between the two rows of the fixing poles and the other end extending out of the enclosure.

2. The bass reflex type speaker device of claim 1, wherein the two protruding portions are connected at opposite ends of the main portion correspondingly and protrudes a distance from the main portion, each protruding portion is curved and the sound path defined therein is curved.

3. The bass reflex type speaker device of claim 1, wherein the main portion comprises a plurality of reinforcing plates fixedly connected to two fixing poles positioned along a direction substantially perpendicular to the bass reflex tube.

4. The bass reflex type speaker device of claim 1, wherein the bass reflex tube comprises a hollow cylindrical body and two fixing portions positioned on the outer surface of an end of the body corresponding to the fixing poles, the end of the tube opposite the fixing portion passes through the through hole and extends out of the enclosure, the fixing portion of the bass reflex tube is fixedly connected to the fixing poles.

5. The bass reflex type speaker device of claim 2, wherein a ratio of the length of the body to the diameter of the speaker is larger than 2.

6. The bass reflex type speaker device of claim 1, wherein the length of the tube is about 80 millimeters, and the diameter of the speaker is about 36 millimeters.

* * * * *